(12) United States Patent
Joye et al.

(10) Patent No.: US 6,903,663 B2
(45) Date of Patent: Jun. 7, 2005

(54) METHOD FOR CONVERTING THE BINARY REPRESENTATION OF A NUMBER IN A SIGNED BINARY REPRESENTATION

(75) Inventors: Marc Joye, Saint Zacharie (FR); Sung-Ming Yen, Chung-Li (TW)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 10/312,530

(22) PCT Filed: Jun. 20, 2001

(86) PCT No.: PCT/FR01/01944

§ 371 (c)(1),
(2), (4) Date: Apr. 23, 2003

(87) PCT Pub. No.: WO02/01727

PCT Pub. Date: Jan. 3, 2002

(65) Prior Publication Data

US 2004/0215684 A1 Oct. 28, 2004

(30) Foreign Application Priority Data

Jun. 30, 2000 (FR) .......................... 00 08547

(51) Int. Cl.[7] .............................. H03M 7/00
(52) U.S. Cl. ......................... 341/50; 341/51
(58) Field of Search ................... 341/50, 51; 708/520

(56) References Cited

U.S. PATENT DOCUMENTS 4,215,417 A * 7/1980 Nishitani .................... 708/520

FOREIGN PATENT DOCUMENTS

DE 43 08 112 10/1994
EP 0 892 520 1/1999

OTHER PUBLICATIONS

Reitwiesner, G.W., "Binary Arithmetic", 1960, Advances in Computers, Academic Press, New York, NY, US, pps. 231–313.

Koyama, K. et al, Speeding Up Elliptic Cryptosystems by Using a Signed Binary Window Method, Advances in Cryptology, Annual International Cryptology Conferences, Proceedings, Springer–Verlag, vol. 40, 1993, pps. 345–357, date unknown.

Chiang, A.C. L. et al, "Arithmetic Norms and Bounds of the Arithmetic AN Codes", IEEE Transactions on Information Theory, US, IEEE Inc., New York, vol. IT–16, No. 4, Jul. 1970, pps. 470–476.

Goto, Munehiro, Nonbinary Cyclic AN Codes, Electron Commun JAP May 1973, vol. 56, No. 5, May 1973, pps. 31–37.

Chao–Liang, Chen et al, "A Simplified Signed Power–s–of–Two Conversion for Multiplierless Adaptive Filters", 1996 IEEE International Symposium on Circuits and Systsm, Circuits and Systems Connecting the World, ISCAS 98, vol. 2, 1996 New York, NY, USA, pps 364–367, date unknown.

* cited by examiner

Primary Examiner—Michael Tokar
Assistant Examiner—Joseph Lauture
(74) Attorney, Agent, or Firm—Burns Doane Swecker & Mathis LLP

(57) ABSTRACT

A method for converting in a binary representation of a number based on a left-to-right processing of bits of the binary representation, to obtain a signed representation equivalent to the so-called Reitwiesner representation. The use of such a conversion method with left-to-right arithmetic processing improves hardware implementation of the method.

17 Claims, 4 Drawing Sheets

| $b_i$ | $r_i$ | $r_{i-1}$ | $r_{i-2}$ | $b_{i-1}$ | $r'_i = (r'_{iH}, r'_{iL})$ |
|---|---|---|---|---|---|
| 0 | 0 | 0 | X | 0 | 0 = (X, 0) |
| 0 | 0 | 1 | 0 | 0 | 0 = (X, 0) |
| 0 | 0 | 1 | 1 | 1 | 1 = (0, 1) |
| 0 | 1 | 0 | X | 0 | 1 = (0, 1) |
| 1 | 0 | 1 | X | 1 | −1 = (1, 1) |
| 1 | 1 | 0 | 0 | 0 | −1 = (1, 1) |
| 1 | 1 | 0 | 1 | 1 | 0 = (X, 0) |
| 1 | 1 | 1 | X | 1 | 0 = (X, 0) |

METHOD FOR CONVERTING THE BINARY REPRESENTATION OF A NUMBER IN A SIGNED BINARY REPRESENTATION

This disclosure is based upon French Application No. 00/08547, filed on Jun. 30, 2000 and International Application No. PCT/FR01/01944, filed Jun. 20, 2001, the contents of which are incorporated herein by reference.

BACKGROUND OF THE INVENTION

The present invention concerns a method of obtaining a signed binary representation of a number from its binary representation.

Fast arithmetic calculation techniques have for a long time been using the signed binary representation, since it makes it possible to calculate additions, multiplications or divisions very effectively.

Many integrated circuits comprise a device for converting a number into signed binary code from its binary representation and arithmetic calculation devices for performing operations with this operand in signed binary representation. In general, a reverse conversion device is provided, for supplying the result in the binary form.

In signed binary representation, a number is expressed in m digits of values "0", "1" or "−1". Several signed binary representations of the same number exist. For example, the number 5 can be written as (1 1 −1), that is to say $1 \times 2^2 + 1 \times 2^1 - 1 \times 2^0$. However, it can also be written (1 0 1).

Amongst the possible signed binary representations, there exists a remarkable one, known as the Reitwiesner representation. This representation has the particularly interesting characteristics of being unique and hollow and having the smallest Hamming weight.

If the binary representation of the number r is denoted $r = (r_{m-1}, \ldots, r_0)$, the Reitwiesner signed binary representation, which is denoted $r = (r'_m, r'_{m-1}, \ldots, r'_2, r'_1, r'_0)$, comprises one additional digit.

To state that this representation is hollow means that it satisfies the fact that the multiplication of two adjacent digits is zero, which is written:

$$r'_i r'_{i-1} = 0, \forall i \in \{0, \ldots m\}.$$

The Hamming weight for its part expresses the number of non-zero digits in the representation in question. Having a minimum Hamming weight therefore means an optimum maximum number of digits at "0". However, the fewer "1" or "−1" digits in the representation, the fewer calculations there are actually to carry out, and hence an improvement in terms of calculation speed. This is therefore a particularly interesting property of the Reitwiesner representation in terms of fast arithmetic calculation.

The algorithm which makes it possible to obtain this remarkable signed binary representation from the binary representation $(r_{m-1}, \ldots, r_0)$ of a number r, can be described as follows:

A calculation variable c is used, in binary.

The bit $c_0$ of rank 0 of this variable c is initialised to "0".

There are added, to the binary representation $(r_{m-1}, \ldots, r_0)$ of the number r, a bit of rank m+1 and a bit of rank m, both initialised to "0": $r_{m-1} = 0$; $r_m = 0$ Then, for i equal to 0 up to i equal to m, the following are calculated:

$$c_{i+1} = \lfloor (c_i + r_i + r_{i-1})/2 \rfloor$$

$$r'_i = c_i + r_i - 2c_{i-1}$$

where $\lfloor t \rfloor$ means the default value, that is to say the integer value immediately lower than the number t. In practice, as the arithmetic sum of the bits $c_i + r_i + r_{i+1}$ is coded in a maximum of two bits in binary, the bit $c_{i+1}$ is obtained by shifting this sum by one position to the right.

It can be seen that, in this Reitwiesner algorithm, the bits $r_i$ of the binary representation of the number r are processed from right to left, in order to obtain each of the digits $r'_i$ of the signed binary representation, from i equals 0 up to i equals m.

Various works were able to show that there was no algorithm in which the bits would be processed from left to right and by means of which the Reitwiesner signed binary representation would be obtained.

However, in many applications, the fast arithmetic calculation algorithms applied to an operand r process the digits $r'_i$ in the signed binary representation of this operand from left to right. These algorithms prove in fact, in some cases, to be more effective both with regard to calculation time and on the hardware level (fewer registers necessary).

If the example is taken of calculating the exponentiation, an algorithm for modular exponentiation of a number $\alpha$ by an exponent r based on the right to left processing (ARL) can be as follows:

There are applied, as inputs of the algorithm, a number $\alpha$, and the signed binary representation $(r'_m, r'_{m-1}, \ldots, r'_2, r'_1, r'_0)$.

The accumulator which contains the result M is initialised to 1, that is to say M=1.

A temporary register is initialised, which contains a calculation variable S with the number $\alpha$ to which the exponentiation is applied.

The following loop is implemented for i equals 0 up to i equals m−1:
if $r'_i = 1$, the content M of the accumulator is multiplied by the variable S, and the result is loaded into the accumulator, which is written: M=M.S
if $r'_i = -1$, the content M of the accumulator is multiplied by the inverse of the variable S, and the result is loaded into the accumulator, which is written $M = M.S^{-1}$.

An algorithm for the modular exponentiation of the number a by the exponent r based on a left to right processing (ALR) of the exponent is as follows:

There are applied as inputs the number $\alpha$, and the signed binary representation $(r'_m, r'_{m-1}, \ldots, r'_2, r'_1, r'_0)$ of the exponent r.

The content M of the accumulator is initialised to 1: M=1.

For i equals m to i equals 0:
the multiplication of the content of the accumulator by itself is performed and the accumulator is loaded with the result, which is written: $M = M^2$, and then
if $r'_i = 1$, the content of the accumulator is multiplied by $\alpha$ and the result is loaded into the accumulator: $M = M.\alpha$, or
if $r'_i = -1$, the content of the accumulator is multiplied by the inverse of $\alpha$ and the result is loaded into the accumulator: $M = M.\alpha^{-1}$.

The right to left algorithm ARL therefore requires at least one additional register, for the variable S, than the left to right algorithm ALR. In addition, S being variable, it is necessary to calculate $S^{-1}$ each time the associated condition is achieved in the right to left algorithm. In the left to right algorithm, $\alpha$ being determined (fixed), its inverse $\alpha^{-1}$ can be calculated only once and stored.

In the invention, it has been sought to combine the advantages of left to right processing both in the method of converting an operand and in the arithmetic processing using this operand.

Thus, in the invention, a signed binary representation equivalent to the Reitwiesner representation has been sought, that is to say a representation which has the same Hamming weight for the same length m (number of digits in the representation).

SUMMARY OF THE INVENTION

The object of the invention is therefore a method of converting a binary representation of a number into a signed binary representation comprising an optimum number, that is to say a maximum number, of zeros (minimum Hamming weight), and in which the bits are processed from left to right.

Another object of the invention is a conversion device for obtaining a corresponding signed binary representation.

As characterised, the invention therefore concerns a method of obtaining a signed binary representation in m+1 digits $(r'_m, \ldots, r'_0)$ of a number from its binary representation in m bits $(r_{m-1}, \ldots, r_0)$. According to this invention, this method consists of:

Adding in the binary representation of the number r to be converted a bit of rank m, a bit of rank −1 and a bit of rank −2 and initialising the said bits to the value 0, Taking at least one calculation variable and initialising to 0 a bit of rank m of this variable, and Performing m+1 iterations of a conversion loop, for i equals m up to i equals 0, the conversion loop comprising the following operations:

Applying as inputs of first calculation means the bit of rank i of the calculation variable b, and the bits of ranks i−1 and i−2 of the binary representation of the number r to be converted, the said first means supplying as an output the bit of rank i−1 of the calculation variable, performing an arithmetic operation equivalent to the default value of the arithmetic sum divided by two of the bits applied as inputs, Applying as inputs of second calculation means the bits of rank i and i−1 of the calculation variable b, and the bit of rank i of the binary representation of the number to be converted r, the said calculation means performing an arithmetic operation equivalent to the multiplication by minus two of the bit of rank i of the calculation variable b, and the arithmetic sum of the preceding result with the other two bits applied as an input, in order to supply as an output the digit of rank i of the signed binary representation.

BRIEF DESCRIPTION OF THE DRAWINGS

Other characteristics arid advantages of the invention are detailed in the following description, given by way of indication and so as not to limit the invention and with reference to the accompanying drawings, in which.

DETAILED DESCRIPTION

Figure 1:
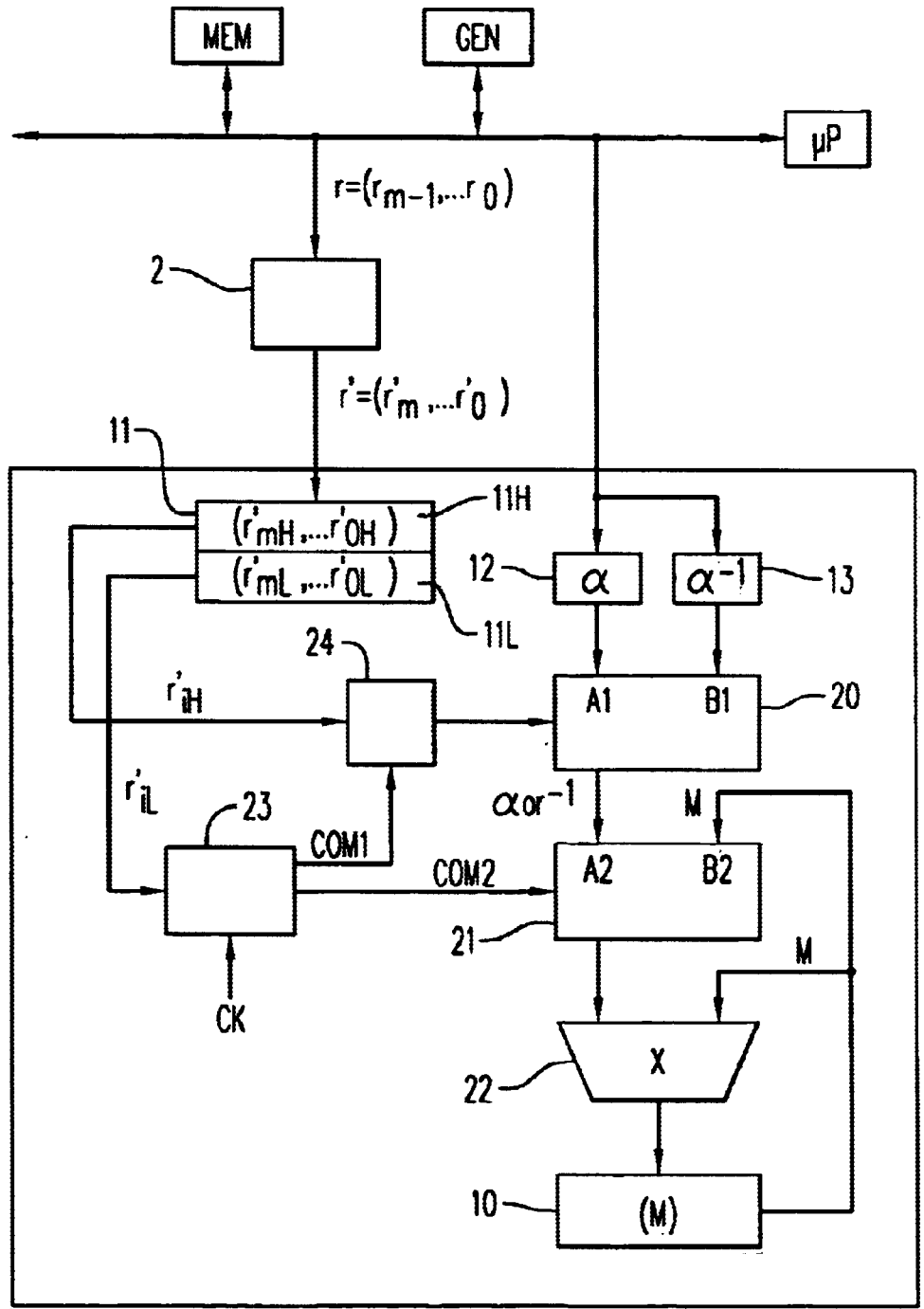
FIG. 1 depicts an integrated circuit comprising such a conversion device and a device for arithmetic calculation of a modular exponentiation.

FIG. 1 depicts an integrated circuit of the microprocessor µP type comprising a memory MEM and a random number generator GEN.

This integrated circuit also comprises a device 1 for the exponentiation calculation of a number α by an exponent r. In the example, the number α is a fixed number contained in memory MEM and the exponent r is a number supplied in binary $(r_{m-1}, \ldots, r_0)$ by the random number generator.

A device 2 for conversion into signed binary is provided in the integrated circuit, for converting the number r applied as an exponent in the calculation device 1.

There is obtained as an output from this conversion device the signed binary representation $(r'_m, \ldots, r'_0)$ according to the invention, applied as an input to the calculation device 1. This signed binary representation is such that it has an optimum Hamming weight, like the so-called Reitwiesner representation.

The calculation device 1 depicted in FIG. 1 makes it possible to apply the left to right modular exponentiation algorithm ALR previously described. In this example, the calculation device comprises an accumulator 10 for the intermediate results and the final result of the exponentiation and three registers: a register 11 for the exponent, a register 12 for the number α and a register 13 for its inverse $α^{-1}$. In reality, the register 11 for the exponent is a double register: since each digit "0", "1", "−1" in signed binary is normally coded in at least two bits.

In one example, this code comprises two bits: one bit for the sign and one bit for the absolute value of the digit. In this example, this then gives: "0"=(X, 0); "1"=(0, 1); "−1"=(1, 1) where X means that the bit can be equal to either to 0 or 1. In the example in the FIGURE, X is equal to 0.

The calculation device 1 also comprises two multiplexers 20 and 21, and a multiplier 22. A control circuit 23 and a switch 24 supply the signals controlling the multiplexers.

The control circuit 23 receives the bit of absolute value $r'_{iL}$ of the digit r'i of rank i of the exponent r (and a sequencing signal Ck). If this bit is equal to "1", it activates (com1) the switch 24, in order to apply the sign bit $r'_{iH}$ of the digit $r'_i$ of the exponent as a control input for the multiplexer 20. Depending on whether the bit $r'_{iH}$ is equal to "0" or "1", the multiplexer 20 then transmits α or $α^{-1}$ as an input for the second multiplexer 21.

This second multiplexer 21 receives at another input the content M of the accumulator 10. It is controlled by an output Com2 of the control circuit 23, in order to apply, to an input of the multiplier 22, either the output of the first multiplexer 20, that is to say α or $α^{-1}$, or the content M of the accumulator.

The result of the output of the multiplexer is loaded into the accumulator.

The control circuit 23 is such that, in each iteration of the calculation loop for a result bit of the modular exponentiation, it first of all demands the switching of the input M output from the multiplexer 21, in order to calculate M.M in the multiplexer, and then, if the absolute value $r'_{iL}$ of the digit $r'_i$ of the exponent is equal to 1, in order to demand the switching of the output of the first multiplexer 20 (α or $α^{-1}$) output from the multiplexer 21.

The calculation device thus allows the calculation of the exponentiation of α by r, by means of a left to right processing.

The association of a left to right conversion device and an arithmetic processing device processing the result of the conversion from left to right, makes it possible to perform all these processing steps in real time. This is because, as soon as the digit r'i is calculated and available at the output of the conversion device 2, it is immediately used in the arithmetic processing device 1.

With a conversion device processing the bits from right to left (Reitwiesner), it is possible to use the signed binary representation only once it is fully calculated, since the last digit converted $r'_m$ is the first used in the arithmetic processing device processing the digits from left to right.

The homogeneity of the left to right processings of the bits in the conversion device according to the invention and of the digits in the calculation devise therefore makes it possible to simplify the hardware implementation of these devices, by saving in particular on registers and improving the performance in terms of calculation speed.

The conversion device is not applied only to a device for calculating an exponentiation. It applies equally well to the calculation of the multiplication of a number α by a number r in signed binary representation, or to the scalar multiplication of a point by the number r in signed binary representation. In the latter case, a particularly interesting application of the-invention concerns the case where the point is taken on an elliptic curve.

Figure 2:
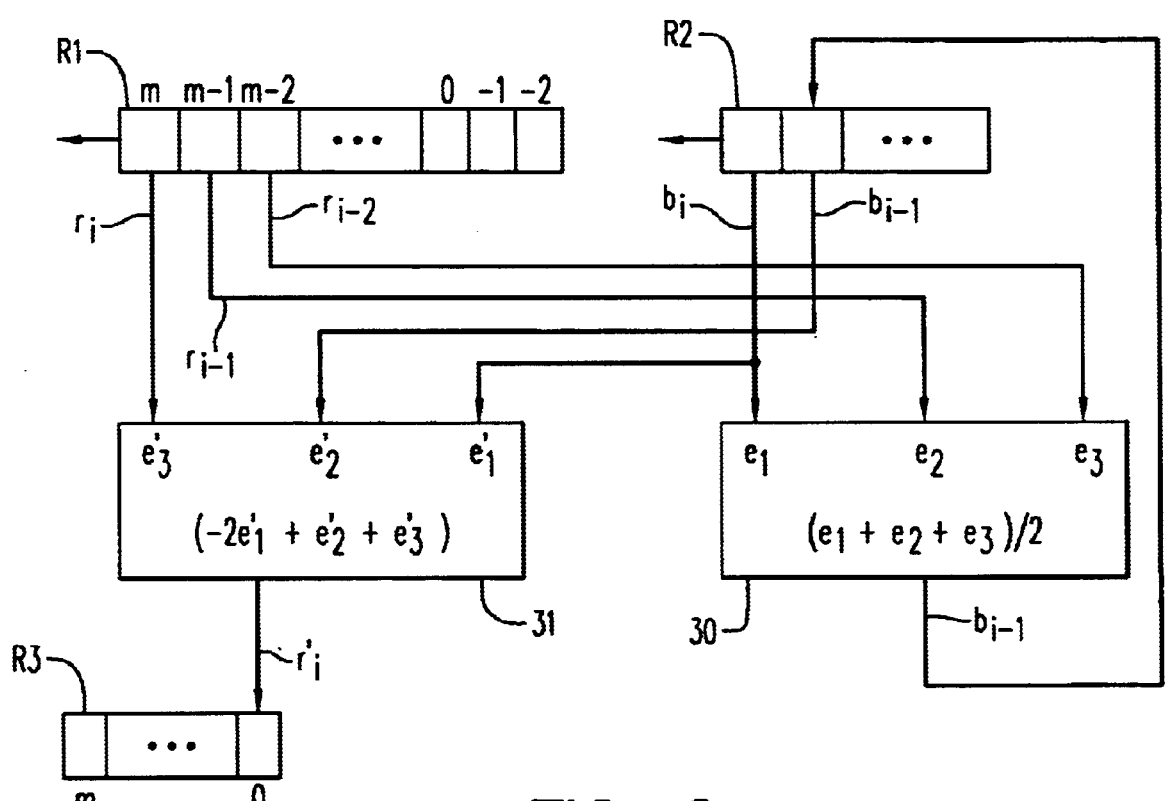
FIG. 2 depicts a block diagram of a conversion device according to the invention.

FIG. 2 depicts a block diagram of a conversion device 2 illustrating a conversion method according to the invention.

The method of obtaining a signed binary representation according to the invention, using left to right processing, is as follows:

There are added, in a register R1 containing the binary representation of the number r, a bit $r_m$ of rank m, a bit $r_{-1}$ of rank −1 and a bit $r_{-2}$ of rank −2, and these three bits are initialised to the value 0.

A calculation variable b is taken from a register R2, and the bit $b_m$ of rank m of this variable is initialised to 0.

m+1 iterations of a conversion loop are performed, from i equals m up to i equals 0, the conversion loop comprising the following operations:

Application as inputs e1, e2, e3 of first calculation means 30 of the bit $b_i$ and the bits $r_{i-1}$, $r_{i-2}$, in order to calculate the arithmetic sum divided by two of these bits and to supply as an output bit $b_{i-1}$ the bit corresponding to the default value of the result, which is written:

$b_{i-1} = \lfloor (b_i + r_{i-1} + r_{i-2})/2 \rfloor$.

Application as inputs e1', e2', e3' of second calculation means 31, of the bits $b_i$, $b_{i-1}$, of the calculation variable b, and of the bit $r_i$ of rank i of the binary representation of the number r, in order to calculate the arithmetic sum of minus twice the bit $b_i$ with the other two bits applied as inputs, and to supply as an output the digit $r'_i$ of the signed binary representation, which is written: $r'_i = -2 \cdot b_i + b_{i-1} + r_i$.

The first and second calculation means can perform the arithmetic operation indicated, or an equivalent arithmetic operation.

These calculations are performed by means of a variable b. However, it is possible to implement the invention by using several variables.

As depicted in FIG. 2, a conversion device for implementing this method comprises the register R1 for containing the signed binary representation of the number r, including the bits $r_m$, $r_{-1}$, $r_{-2}$ added to this representation. This register is of the shift to the left type, corresponding to the direction of processing of the bits from left (i=m) to right (i=0). The outputs of rank m, m−1 and m−2 of the register R1 are thus respectively applied to the input e'3 of the second calculation means 31, and to the inputs e2 and e3 of the first calculation means 30. At the end of each iteration, the register R1 is shifted by one position to the left, so that the outputs of rank m, m−1 and m−2 supply at each iteration the corresponding bits of rank i, i−1 and i−2.

The conversion device comprises another register R2 for the calculation variable b, also of the shift to the left type. In the example, this register comprises for each iteration the bit $b_i$ and the bit $b_{i-1}$. As the bit $b_{i-1}$ is established from the bit $b_i$, the first calculation means are activated first, in order to load into the register R2 the new value $b_{i-1}$, to be used in the current iteration, in the second calculation means.

At the end of the iteration, the register R2 is shifted by one position to the left, for the following iteration.

In the invention, it has been possible to establish a look-up table corresponding to the conversion method which has just been disclosed. This look-up table depicted in FIG. 3 simplifies the conversion according to the invention. This is because it directly gives the result as an output, according to the inputs. In addition the register R2 in FIG. 2 can then be produced in the form of a simple latch, in order to contain, for the current iteration i, the bit $b_i$.

In order to obtain this table, the value of the bit $b_{i-1}$ was determined for each possible triplet (e1, e2, e3)=($b_i$, $r_{i-1}$, $r_{i-2}$), and the value of the digit $r'_i$ for each possible triplet as inputs (e1', e2', e3')=($b_i$, $r_i$, $b_{i-1}$) from the conversion algorithm according to the invention disclosed previously in relation to FIG. 2.

It has thus been possible to show that it was possible to determine the value of the bit bi, and of the digit $r_i$, from the quadruplet ($b_i$, $r_i$, $r_{i-1}$ and $r_{i-2}$), for each of the possible values of the latter.

With this conversion table, only the bit $b_i$ of the variable b is used as an input for the current iteration. The bit $b_{i-1}$ supplied as an output serves for the following iteration. Thus, with such a look-up table, the register R2 can be reduced to a simple latch, the new value of which is loaded at the end of each iteration, by the bit $b_{i-1}$ supplied as an output by the table. This new value becomes that of the bit $b_i$ in the following iteration.

Figures 3, 4:
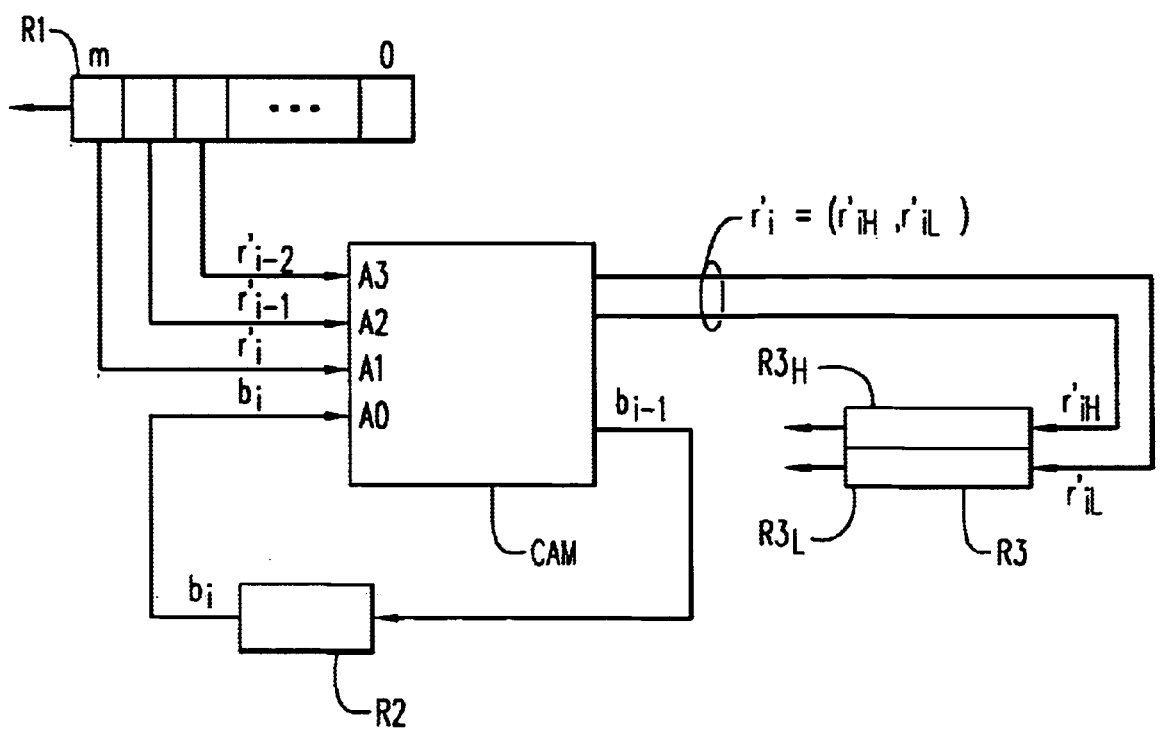
FIG. 3 depicts a look-up table which can be used for carrying out a conversion according to the method of the invention.
FIG. 4 depicts an example embodiment of a conversion device using such a table.

An example of a practical embodiment of a conversion device according to the invention using such a conversion table is depicted in FIG. 4. It comprises a content addressable memory, denoted CAM. The look-up table in FIG. 3 is programmed in this memory so that, by applying the bits $b_i$, $r_i$, $r_{i-1}$ and $r_{i-2}$ to the address bits A0, A1, A2, A3 of this memory, it supplies as an output the corresponding bit $b_{i-1}$ and digit $r'_i$.

At the end of each iteration, the bit $b_{i-1}$ is loaded into the register R2. This bit becomes the bit $b_i$ for the following iteration of the loop.

The digit $r'_i$ is loaded into a register R3, which comprises in practice a first register R3H, for containing the signed bit $r'_{iH}$ of each digit of the signed binary representation and a second register R3L for containing its absolute value $r'_{iL}$.

Figure 5:
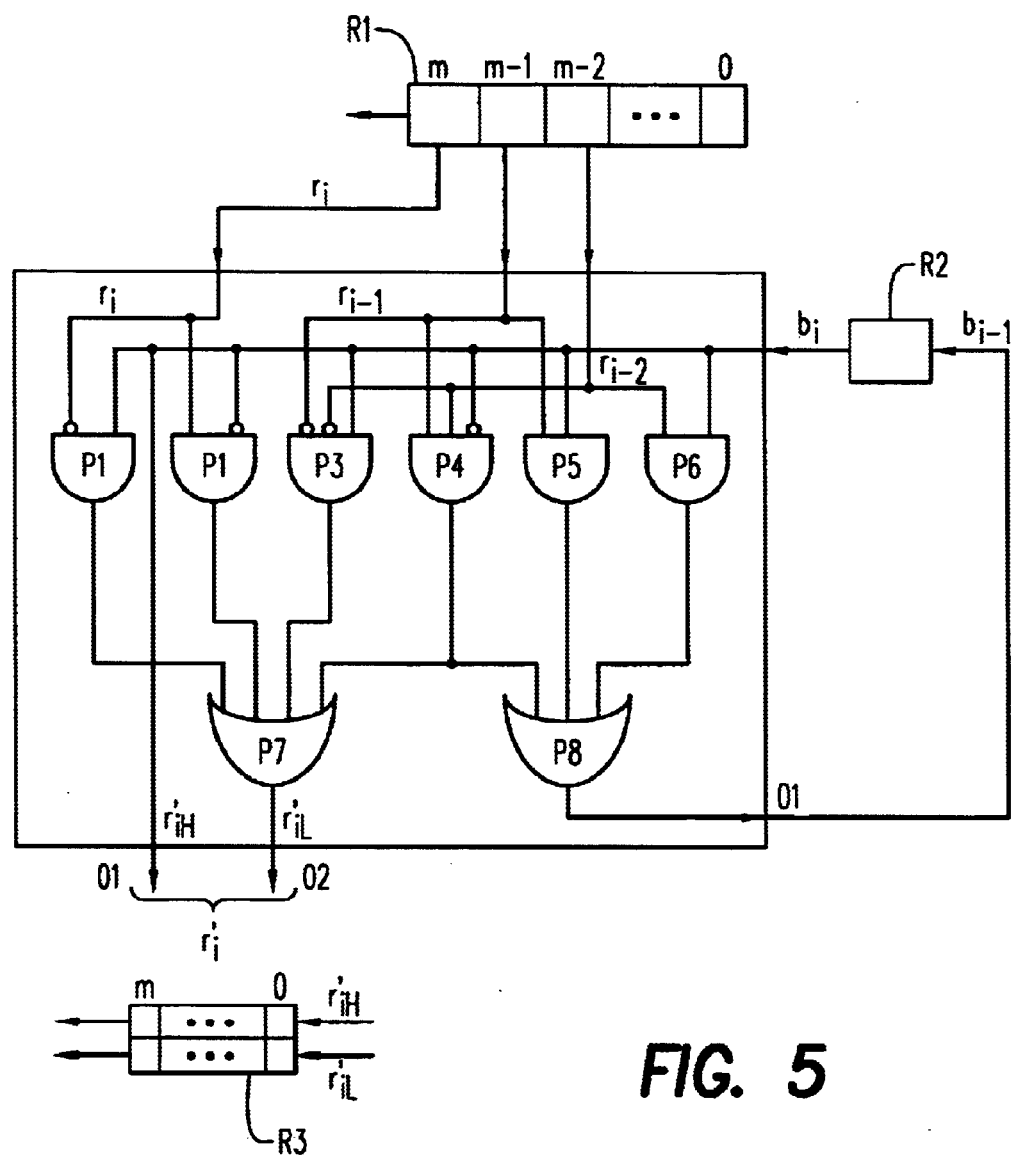
FIG. 5 depicts another example embodiment of a conversion device according to the invention, using Boolean operators.

Another example embodiment of a conversion device according to the invention is shown in FIG. 5. In this example, the conversion device is based on Boolean operators. Here also, the register R2 can be a simple latch reloaded by the bit bi, determined in the current iterations.

The definition of the Boolean operators results from work consisting of logic manipulation and minimalisation of the algorithm corresponding to the conversion method and to the look-up table according to the invention.

In the invention, it has been possible to define these operators from the bits $b_i$, $r_i$, $r_{i-1}$ and $r_{i-2}$, in order to obtain directly as an output the bit $b_{i-1}$ and the digit $r'_i$.

By using the coding in two bits representing the sign and the absolute value, it has been possible to define the following Boolean operations:

$$b_{i-1} = /b_i.r_{i-1}.r_{i-2} + b_i.r_{i-1} + b_i.r_{i-2};$$

$$r'_{iH} = b_i;$$

$$r'_{iL} = /b_i.r_{i-1}.r_{i-2} + /b_i.r_i + .b_{i-} / r_i + b_i / r_{i-1}.r_{i-2}.$$

It should be noted that, when the digit $r'_i$ is zero, that is to say if $r'_{iL}=0$, the signed bit $r'_{iH}$ can be taken to be equal to either 0 or 1. Making $r'_{iH}=b_i$ thus covers all cases, if any value 0 or 1 is accepted for the signed bit in the case where the digit is equal to 0. However, provision can be made for this signed bit to be fixed, for example fixed at 0, when the digit equals 0, as in the example given in FIG. 1.

An example of a corresponding embodiment of a conversion device comprising Boolean operators is depicted in FIG. 5. In this example, the conversion device comprises, in addition to the registers R1 and R2:

A first gate P1 of the AND type, comprising an inverting input for receiving the bit $r_i$, and a non-inverting input for receiving the bit $b_i$;

A second gate P2 of the AND type with the opposite inputs to the first;

A third gate P3 of the AND type, comprising an inverting input for receiving the bit $r_{i-1}$, another inverting input for receiving the bit $r_{i-2}$ and a non-inverting input for receiving the bit $b_i$;

A fourth gate P4 of the AND type, receiving the opposite inputs to the third gate;

A fifth gate P5 of the AND type comprising a non-inverting input for receiving the bit $r_{i-1}$, and another non-inverting input for receiving the bit $b_i$;

A sixth gate P6 of the AND type, comprising a non-inverting input for receiving the bit $r_{i-2}$, and another non-inverting input for receiving the bit $b_i$;

A seventh gate P7 of the OR type, receiving as inputs the outputs of the first, second, third and fourth gates, and supplying as an output the absolute value $r'_{iL}$ (0 or 1) of the digit $r'_i$ of rank i of the signed binary representation, the signed bit $r'_{iH}$ being supplied by the bit $b_i$; and An eighth gate P8 of the OR type, receiving as inputs the outputs of the fourth, fifth and sixth gates, in order to supply the bit $b_{i-1}$ as an output.

The registers R1, R2 and R3, which contain respectively the binary representation of r, the calculation variable and the result of the conversion into signed binary are controlled as in FIG. 4.

The invention which has just been described can be used in many applications, and in particular those using cryptographic methods. It is applicable for supplying the signed binary representation of an operand used in any arithmetic processing, preferably processing the bits from left to right in order to extract therefrom the greatest benefit in terms of simplicity of design and processing speed. It should be noted that an example of application of the invention to the exponentiation of a fixed number by a variable number r (random) has been given, which uses the techniques of calculation by squares and multiplications (square and multiply). The invention applies equally well to the exponentiation of a random number by a fixed number r, which uses the techniques of additive chains. More generally, the invention applies to arithmetic calculation devices for the multiplication of a number a by the number r in signed binary representation, or to the scalar multiplication of a point by the number r. In the latter case, a particularly interesting application of the invention concerns the case where the point is taken on an elliptic curve. The list of possible applications is not exhaustive.

In all these applications the number of operations is reduced, as with the Reitwiesner representation, because of the minimum Hamming weight, with the additional advantages related to the left to right processing (hardware simplicity, reduction in the number of registers, processing in real time).

What is claimed is:

1. A method of converting a number (r) into a signed binary representation in m+1 digits ($r'_m, \ldots, r'_0$) from its binary representation in m bits ($r_{m-1}, \ldots, r_0$), comprising the steps of:

a) adding a bit ($r_m$) of rank m, a bit ($r_{-1}$) of rank −1 and a bit ($r_{-2}$) of rank −2 to the binary representation of the number (r), and initializing said added bits to a value of 0, b) providing at least one calculation variable (b), c) initialising to the value 0 a bit of rank m ($b_m$) of said variable, and d) performing a conversion loop, for i equals m to 0, comprising the following operations:

(1) applying as inputs (e1, e2, e3) of a first calculation means the bit of rank i ($b_i$) of the calculation variable (b), and the bits of ranks i−1 and i−2 ($r_{i-1}, r_{i-2}$) of the binary representation of the number to be converted, said first calculation means performing an arithmetic sum of the bits applied as inputs (e1, e2, e3) and dividing said sum by two, to supply as an output the bit of rank i−1($b_{i-1}$) of the calculation variable (b), (2) applying as inputs (e1', e2', e3') of a second calculation means, the bits ($b_i$, $b_{i-1}$) of rank i and i−1 of the calculation variable (b), and the bit ($r_i$) of rank i of the binary representation of the number to be converted (r), said second calculation means performing an arithmetic operation equivalent to the multiplication by minus two of the bit of rank i of the calculation variable (b), and the arithmetic sum of said multiplication with the other two bits applied as an input, in order to supply as an output the digit of rank i ($r'_i$) of the signed binary representation.

2. A method according to claim 1, further including the step of applying the signed binary representation an operand to an arithmetic calculation device, wherein said calculation device processes the digits of said operand from highest to least high rank.

3. A conversion method according to claim 1, wherein said first and second calculation means comprise a conversion table with four inputs, said inputs corresponding to the bit ($b_i$) of rank i of the calculation variable (b), and to the bits ($r_i$, $r_{i-1}$, $r_{i-2}$) of rank i, i−1 and i−2 of the binary representation of the number to be converted (r), in order to supply directly as an output the value of the bit ($b_{i-1}$) of rank i−1 of the calculation variable (b) and the value of the digit ($r'_i$) of rank i of the signed binary representation.

4. A device for conversion into signed binary for the implementation of a method according to claim 3, comprising a content addressable memory, wherein the bit ($b_i$) of rank i of the calculation variable (b), and the bits ($r_i$, $r_{i-1}$, $r_{i-2}$) of rank i, i−1 and i−2 of the binary representation of the number to be converted (r) are applied to said memory as address bits (A0, A1, A2, A3).

5. A conversion device according to claim 4, comprising a first shift to the left input register for containing the binary representation of the number to be converted (r) and a second shift to the left register for containing the calculation variable (b).

6. A device according to claim 5, wherein said second register is a latch which contains the bit of rank i corresponding to a current iteration, and wherein the bit of rank i−1 delivered as an output in one iteration is loaded into the latch in order to supply the bit of rank i in a succeeding iteration.

7. An integrated circuit comprising a conversion device according to claim 4, further comprising a device for arithmetic calculation by processing from the digit of the highest rank to the digit of the lowest rank in the signed binary representation.

8. An integrated circuit according to claim 7, wherein said arithmetic calculation device is a device for exponentiation of a number ($\alpha$) by the signed binary representation of the number (r) applied to the conversion device.

9. An integrated circuit according to claim 7, wherein said arithmetic calculation device is a device for multiplying a number ($\alpha$) by the signed binary representation of the number (r) applied to the conversion device.

10. An integrated circuit according to claim 7, wherein said arithmetic calculation device is a device for the scalar multiplication of a point ($\alpha$) by the signed binary representation of the number (r) applied to the conversion device.

11. An integrated circuit according to claim 10, wherein said point is taken on an elliptic curve.

12. A conversion method according to claim 1, wherein each digit ($r'_i$) of the signed binary representation is supplied as an output in the form of a code with at least two bits.

13. A conversion method according to claim 12, wherein each digit is coded in two bits, a first bit corresponding to an absolute value ($r'_{iL}$) and a second bit corresponding to a signed bit ($r'_{iH}$), and wherein the first bits are stored in a first output register and the second bits of these digits are stored in a second output register, said output registers being of the shift to the left type.

14. A conversion device implementing the conversion method according to claim 1, wherein the first and second calculation means comprise Boolean operators.

15. A conversion device according to claim 14, wherein said Boolean operators receive as inputs the bit of rank i of the calculation variable (b), denoted $b_i$, and the bits of rank i, i−1 and i−2 of the binary representation of the number to be converted (r), respectively denoted $r_i$, $r_{i-1}$ and $r_{i-2}$, in order to supply as an output the bit of rank i−1 of the calculation variable (b), denoted $b_{i-1}$ and the digit of rank i, denoted $r'_i$ of the signed binary representation.

16. A conversion device according to claim 15 wherein each digit of the signed binary representation is supplied in the form of a two-bit code and wherein said Boolean operators comprise a set of logic gates to apply to the bits of inputs $b_i$, $r_i$, $r_{i-1}$ and $r_{i-2}$ a first Boolean operation equivalent to /$b_i.r_{i-1}.r_{i-2}$+$b_i.r_{i-1}$+$b_1.r_{i-2}$, in order to supply as an output the bit $b_{i-1}$ and a second Boolean operation equivalent to /$b_i.r_{i-1}.r_{i-2}$+/$b_i.r_i$+.$b_i./r_i$+$b_i./r_{i-1}./r_{i-2}$, in order to supply as an output a bit representing an absolute value ($r_{iL}$) of the digit of rank i ($r'_i$) of the signed binary representation, and bits ($r_{iH}$) representing the sign of said digit being equal to the bit of rank i ($b_i$) of the calculation variable or equal to 0 or 1 if said digit is zero.

17. A conversion device according to claim 16, wherein said Boolean operators comprise:

a) a first gate of the AND type, comprising an inverting input for receiving the bit ($r_i$) of rank i of the binary representation of the number to be converted (r), and a non-inverting input for receiving the bit ($b_i$) of rank i of the calculation variable;

b) a second gate of the AND type with inputs opposite to those of the first gate;

c) a third gate of the AND type, comprising an inverting input for receiving the bit ($r_{1-1}$) of rank i−1 of the binary representation of the number to be converted (r), another inverting input for receiving the bit ($r_{i-2}$) of rank i−2 of the binary representation of the number to be converted (r), and a non-inverting input for receiving the bit ($b_i$) of the calculation variable (b);

d) a fourth gate of the AND type, receiving inputs opposite to those of the third gate;

e) a fifth gate of the AND type comprising a non-inverting input for receiving the bit ($r_{i-1}$) of rank i−1 of the binary representation of the number to be converted (r), and another non-inverting input for receiving the bit ($b_i$) of rank i of the calculation variable (b);

f) a sixth gate of the AND type, comprising a non-inverting input for receiving the bit ($r_{i-2}$) of rank i−2 of the binary representation of the number to be converted (r), and another non-inverting input for receiving the bit ($b_i$) of rank i of the calculation variable (b);

g) a seventh gate of the OR type, receiving as inputs the outputs of the first, second, third and fourth gates, and supplying as an output the bit ($r'_{iL}$) representing the absolute value (0 or 1) of the digit ($r'_i$) of rank i of the signed binary representation, the bit ($r'_{iH}$) representing the sign being supplied by the bit ($b_i$) of rank i of the calculation variable (b); and h) an eighth gate of the OR type, receiving as inputs the output of the fourth, fifth and sixth gates, to supply the bit ($b_{i-1}$) of rank i−1 of the calculation variable (b) as an output.

* * * * *